United States Patent
Wang

(10) Patent No.: US 10,545,805 B2
(45) Date of Patent: Jan. 28, 2020

(54) MEMORY SYSTEM, READING METHOD THEREOF AND WRITING METHOD THEREOF

(71) Applicant: MACRONIX INTERNATIONAL CO., LTD., Hsinchu (TW)

(72) Inventor: Shih-Chung Wang, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 170 days.

(21) Appl. No.: 15/472,319

(22) Filed: Mar. 29, 2017

(65) Prior Publication Data
US 2018/0285185 A1   Oct. 4, 2018

(51) Int. Cl.
| | | |
|---|---|---|
| G06F 11/00 | (2006.01) |
| G06F 11/07 | (2006.01) |
| G06F 11/10 | (2006.01) |
| G11C 29/00 | (2006.01) |
| G11C 29/52 | (2006.01) |
| G11C 29/44 | (2006.01) |

(52) U.S. Cl.
CPC ...... G06F 11/0727 (2013.01); G06F 11/0751 (2013.01); G06F 11/0793 (2013.01); G06F 11/1088 (2013.01); G06F 11/1092 (2013.01); G11C 29/4401 (2013.01); G11C 29/52 (2013.01); G11C 29/70 (2013.01); *G11C 2029/4402* (2013.01)

(58) Field of Classification Search
CPC ............ G06F 11/0727; G06F 11/0751; G06F 11/0793
See application file for complete search history.

(56) References Cited

U.S. PATENT DOCUMENTS

| | | | |
|---|---|---|---|
| 7,222,257 B1 | 5/2007 | Dibb | |
| 8,296,358 B2 | 10/2012 | Zuckerman et al. | |
| 9,202,572 B2 * | 12/2015 | Bronner | G11C 13/0002 |
| 9,245,636 B2 * | 1/2016 | Lin | G11C 16/26 |
| 9,367,241 B2 | 6/2016 | Sundaram et al. | |

(Continued)

FOREIGN PATENT DOCUMENTS

CN   103488583 A   1/2014

OTHER PUBLICATIONS

Sebastian Anthony, Self-healing self heating flash memory survives more than 100 million cycles (Year: 2012).*

(Continued)

*Primary Examiner* — Marc Duncan
*Assistant Examiner* — Jonathan D Gibson
(74) *Attorney, Agent, or Firm* — McClure, Qualey & Rodack, LLP

(57) ABSTRACT

A memory system, a reading method and a writing method are provided. The memory system includes a memory controller and a memory array electrically connected to the memory controller. A parity information is stored in the memory array. The memory array includes a plurality of memory devices. The reading method comprises the following steps: A reading command for requesting a user data stored in the memory array is received from a host interface. The user data is recovered according to the parity information when the user data is error at one of the memory devices. The user data, which is recovered, is transferred to the host interface and the user data is refreshed.

6 Claims, 10 Drawing Sheets

(56) References Cited

U.S. PATENT DOCUMENTS

| | | | |
|---|---|---|---|
| 9,455,038 B2 * | 9/2016 | Tuers | G11C 16/349 |
| 9,653,139 B1 * | 5/2017 | Park | G11C 11/40615 |
| 9,761,290 B1 * | 9/2017 | Kankani | G11C 7/20 |
| 10,082,965 B1 * | 9/2018 | Tamilarasan | G06F 12/00 |
| 2003/0066010 A1 * | 4/2003 | Acton | G11B 20/18 |
| | | | 714/758 |
| 2003/0120863 A1 * | 6/2003 | Lee | G06F 11/1084 |
| | | | 711/114 |
| 2007/0245083 A1 * | 10/2007 | Margolus | G06F 11/1096 |
| | | | 711/114 |
| 2009/0055507 A1 * | 2/2009 | Oeda | G06F 9/4856 |
| | | | 709/216 |
| 2010/0025811 A1 * | 2/2010 | Bronner | H01L 21/67103 |
| | | | 257/528 |
| 2010/0230807 A1 * | 9/2010 | Bronner | G11C 16/3418 |
| | | | 257/734 |
| 2011/0228601 A1 | 9/2011 | Olbrich et al. | |
| 2011/0299317 A1 * | 12/2011 | Shaeffer | G11C 13/0002 |
| | | | 365/106 |
| 2013/0205076 A1 * | 8/2013 | Schuette | G06F 12/0246 |
| | | | 711/103 |
| 2014/0208155 A1 * | 7/2014 | Pan | G06F 11/2087 |
| | | | 714/6.21 |
| 2014/0254286 A1 * | 9/2014 | Bronner | G11C 13/0002 |
| | | | 365/185.29 |
| 2014/0286105 A1 * | 9/2014 | Lin | G11C 16/26 |
| | | | 365/185.24 |
| 2015/0012503 A1 | 1/2015 | Akirav et al. | |
| 2016/0055910 A1 * | 2/2016 | Tuers | G11C 16/349 |
| | | | 365/185.03 |
| 2016/0078952 A1 * | 3/2016 | Lin | G11C 16/26 |
| | | | 365/185.29 |
| 2018/0189149 A1 * | 7/2018 | Alavi | G06F 11/0793 |
| 2018/0285185 A1 * | 10/2018 | Wang | G06F 11/0727 |

OTHER PUBLICATIONS

TIPO Office Action dated Oct. 17, 2017 in Taiwan application (No. 106110743).

* cited by examiner

MEMORY SYSTEM, READING METHOD THEREOF AND WRITING METHOD THEREOF

TECHNICAL FIELD

The disclosure relates in general to a memory system, a reading method thereof and a writing method thereof, and more particularly to a memory system, a reading method thereof and a writing method thereof.

BACKGROUND

Recently, storages can apply RAID (Redundant Array of Independent Disks) technology to prevent damage from a device crash. On the other hand, many applications use a memory device, such as NAND flash, to improve performance.

Since the NAND flash has the disturbance and retention matters, the performance will be dropped down after the NAND flash is worked for a long period.

Moreover, the NAND flash will wear out after writing lots of data, and it causes no free block to update data or read corrupt data.

SUMMARY

The disclosure is directed to a memory system, a reading method thereof and a writing method thereof.

According to a first aspect of the present disclosure, a reading method of a memory system is provided. The memory system includes a memory controller and a memory array electrically connected to the memory controller. A parity information is stored in the memory array. The memory array includes a plurality of memory devices. The reading method comprises the following steps: A reading command for requesting a user data stored in the memory array is received from a host interface. The user data is recovered according to the parity information when the user data is error at one of the memory devices. The user data, which is recovered, is transferred to the host interface and the user data is refreshed.

According to a second aspect of the present disclosure, a writing method of a memory system is provided. The memory system includes a memory controller and a memory array electrically connected to the memory controller. A parity information is stored in the memory array. The memory array includes a plurality of memory devices. The writing method comprises the following steps: A writing command for writing a user data into the memory array is received. A plurality of pages of the memory array are allocated to store the user data. If one of the pages being allocated is unavailable to be accessed at one of the memory devices, the user data and the parity information corresponding to the user data are stored in the pages being allocated except the memory device which is unavailable to be accessed. A heating repair operation on the memory device which is unavailable to be accessed is executed. The user data is restored to the memory array after the heating repair operation is finished.

According to a third aspect of the present disclosure, a memory system is provided. The memory system includes a memory controller and a memory array. The memory array includes a plurality of memory devices. A parity information is stored in the memory array. The control table includes a refresh list. When a user data is error at one of the memory devices, an identifier of one of the memory devices whose user data is error is recorded into the refresh list.

The above and other aspects of the disclosure will become better understood with regard to the following detailed description of the preferred but non-limiting embodiment(s). The following description is made with reference to the accompanying drawings.

DETAILED DESCRIPTION

Figure 1:
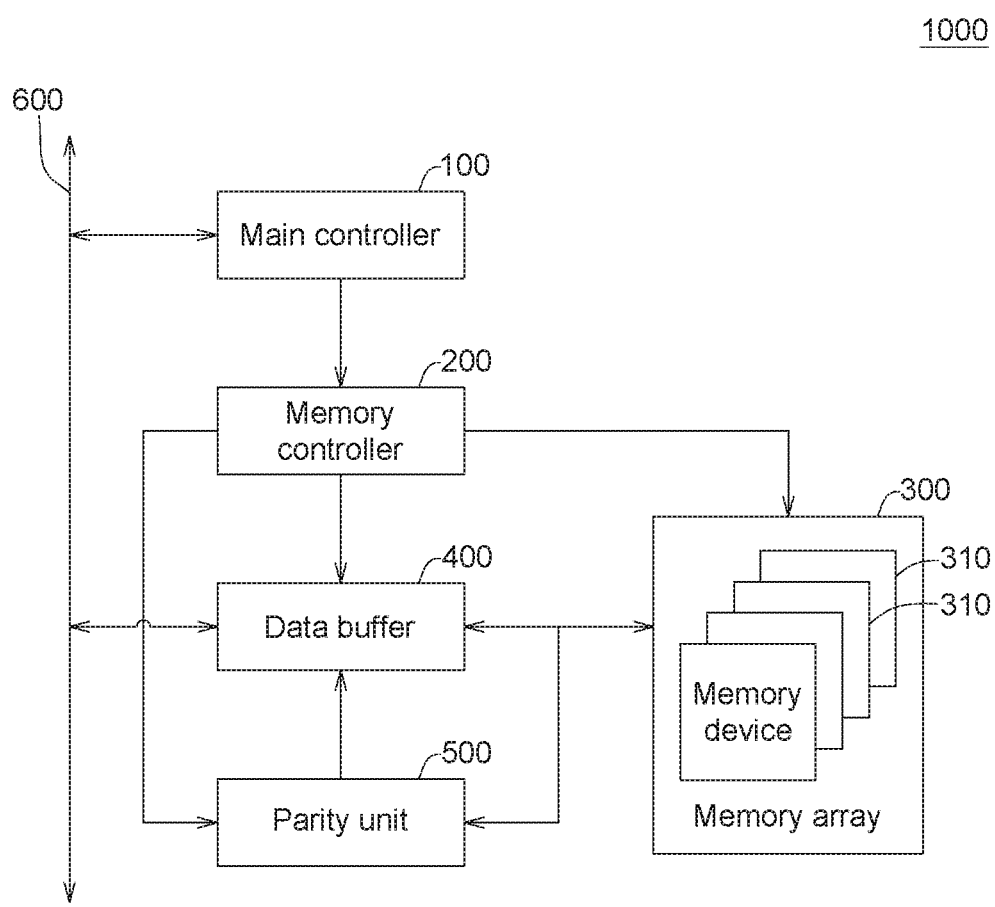
FIG. 1 shows a memory system.

Please refer to FIG. 1, which shows a memory system 1000 according to one embodiment. For example, the memory system 1000 may be a RAID (Redundant Array of Independent Disks) memory system. The memory system 1000 includes a main controller 100, a memory controller 200, a memory array 300, a data buffer 400, a parity unit 500 and a host interface 600. The main controller 100 is used for receiving the command provided from the host interface 600 and controlling the memory controller 200 accordingly. The memory controller 200 is used for controlling the access and operation of the memory array 300, the data buffer 400 and the parity unit 500. For example, the main controller 100 and the memory controller 200 may be a circuit, a chip, a circuit board, a storage device storing a plurality of program codes.

The data buffer 400 is used for temporarily storing the user data provided from the host interface 600 or the memory array 300. For example, the data buffer 400 may be a RAM, such as DRAM or SRAM.

The parity unit 500 is used for distributing the parity information or performing the recovering procedure according to the parity information. For example, the parity unit 500 may be a circuit, a chip, a circuit board, a storage device storing a plurality of program codes.

The memory array 300 includes a plurality of memory devices 310. The memory array 300 is used for storing the user data for a long time. For example, the memory devices 310 may form a RAID data structure. The parity information and the user data are stored in different area of the memory array 300. The user data may be error at one of the memory devices 310. The user data which is error can be recovered according to the parity information and the user data stored in the other memory devices 310. For example, the memory device 310 may be a NVRAM or a flash, such as a NAND flash.

Figure 2:
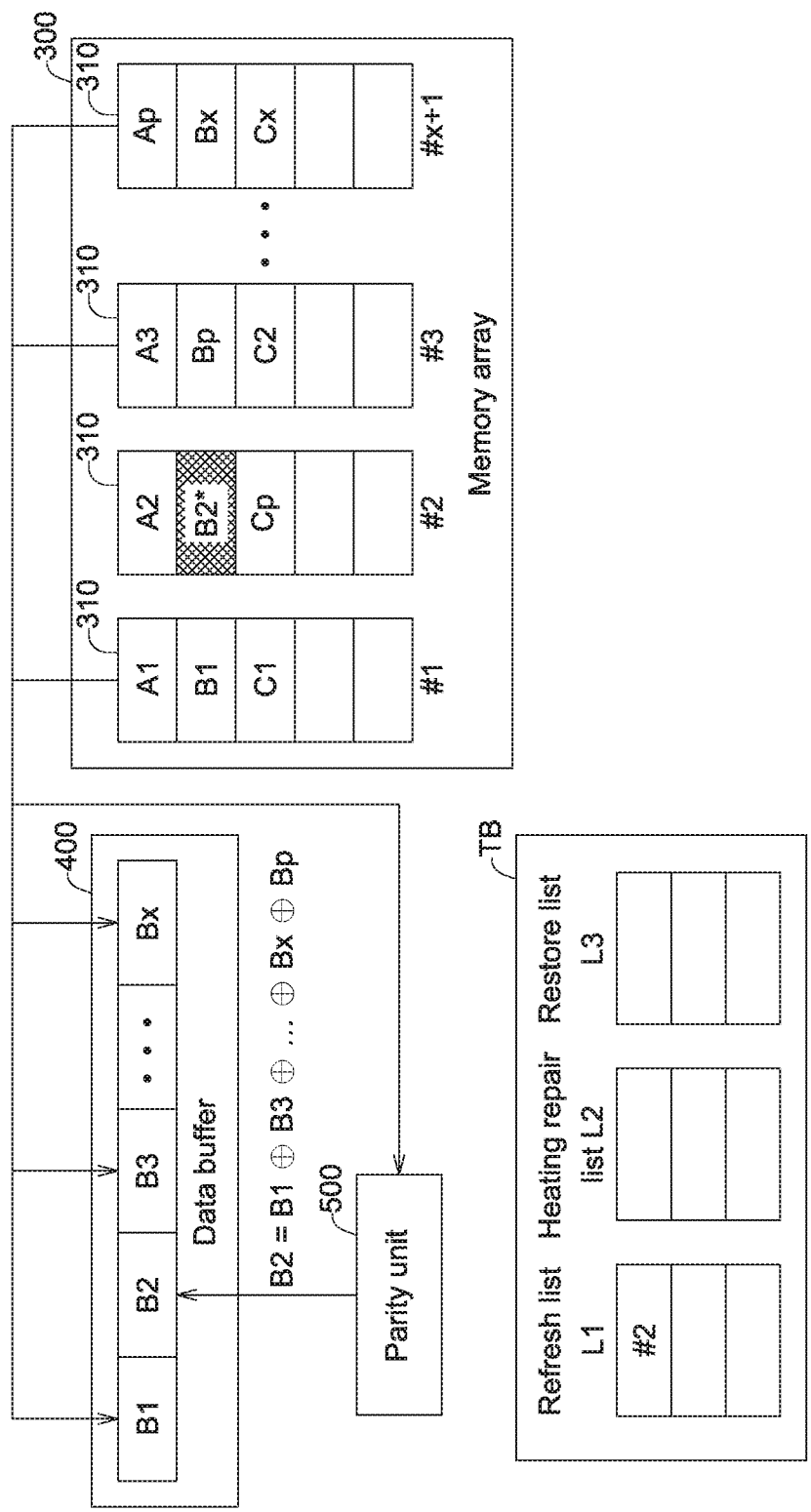
FIGS. 2 and 3 illustrate an example of a reading method of the memory system.
Figure 3:
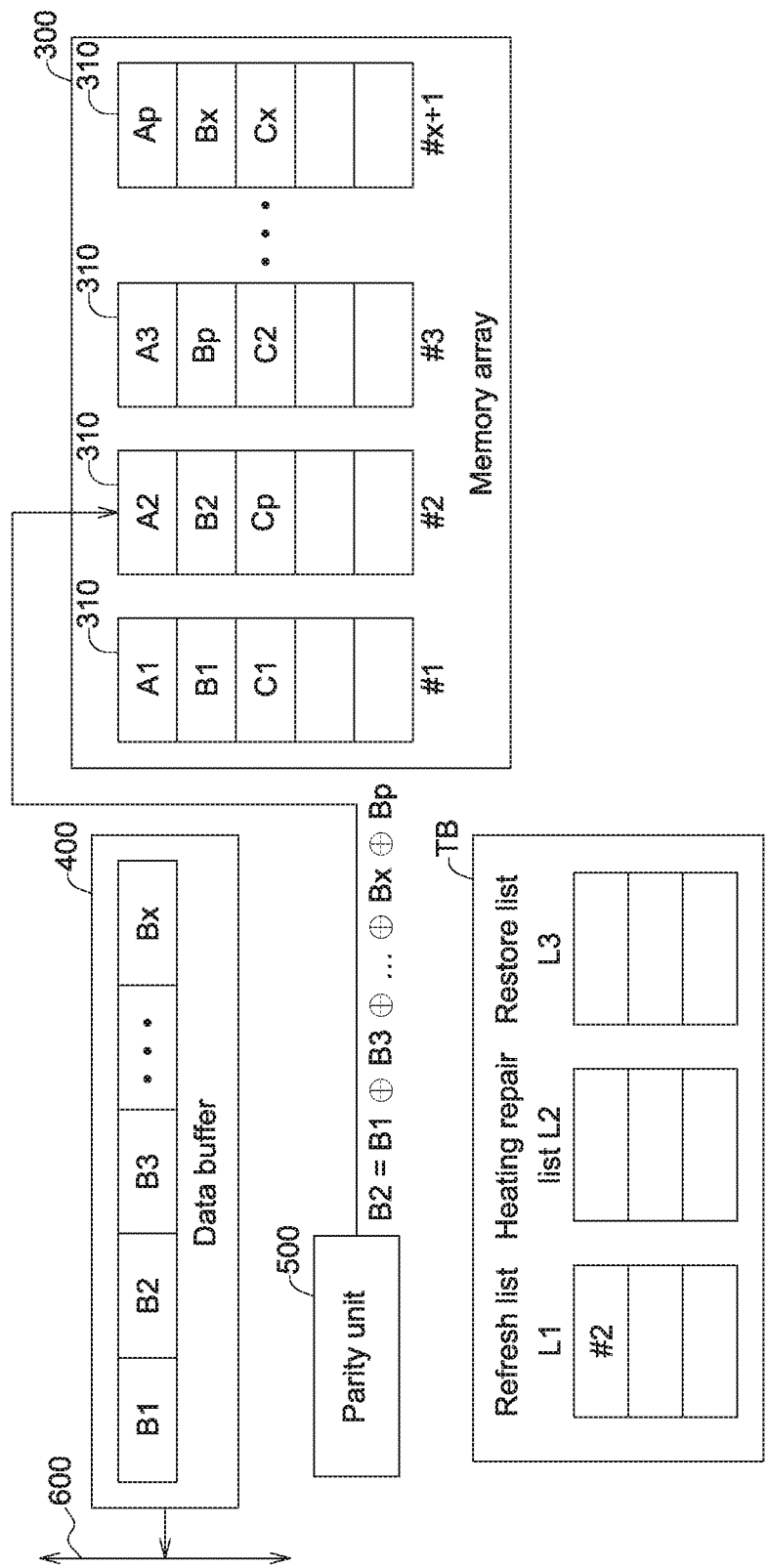

Please refer to FIGS. 2 and 3, which illustrate an example of a reading method of the memory system 1000. As shown in FIG. 2, a control table TB including a refresh list L1, a heating repair list L2 and a restore list L3 are shown. The control table TB may be stored in the memory array 300, or may be stored in another non-volatile memory.

As shown in FIG. 2, the memory array 300 is used for storing the user data A1, A2, A3, . . . , B1, . . . , Bx, C1, C2, . . . Cx and the parity information Ap, Bp, Cp. The memory device 310 whose identifier is "#1" is used for storing the user data A1, the user data B1 and the user data C1. The memory device 310 whose identifier is "#2" is used for storing the user data A2, the user data B2 and the parity information Cp. The memory device 310 whose identifier is "#3" is used for storing the user data A3, the user data C2 and the parity information Bp. The memory device 310 whose identifier is "#x+1" is used for storing the user data Bx, the user data Cx and the parity information Ap.

As shown in FIG. 2, the user data B1 to the user data Bx are going to be read out. At first, the user data B1 to the user data Bx are needed to be read to the data buffer 400. However, the user data B2 at the memory device 310 whose identifier is "#2" is error. Next, the parity unit 500 can perform the equation (1) to recover the incorrect user data B2* to be the correct user data B2 according to the parity information Bp and the user data B1, the user data B3, . . . , the user data Bx. In another embodiment, the recovering operation is not limited to the equation (1).

$$B2=B1 \oplus B3 \oplus \ldots \oplus Bx \oplus Bp \quad (1)$$

After the user data B2 is recovered, the user data B2 is stored in the data buffer 400, and the identifier of this memory device 310, i.e. "#2", is recorded into the refresh list L1 of the control table TB.

Next, as shown in FIG. 3, the user data B1 to the user data Bx stored in the data buffer 400 can be totally read to the host interface 600. "#2" is recorded in the refresh list L1, so the parity unit 500 refreshes the user data B2* at the memory device 310 whose identifier is "#2" by performing the equation (1). As such, even if the user data B2* is error, the user data B1 to the user data Bx can be successfully read out and refreshed.

Figure 4:
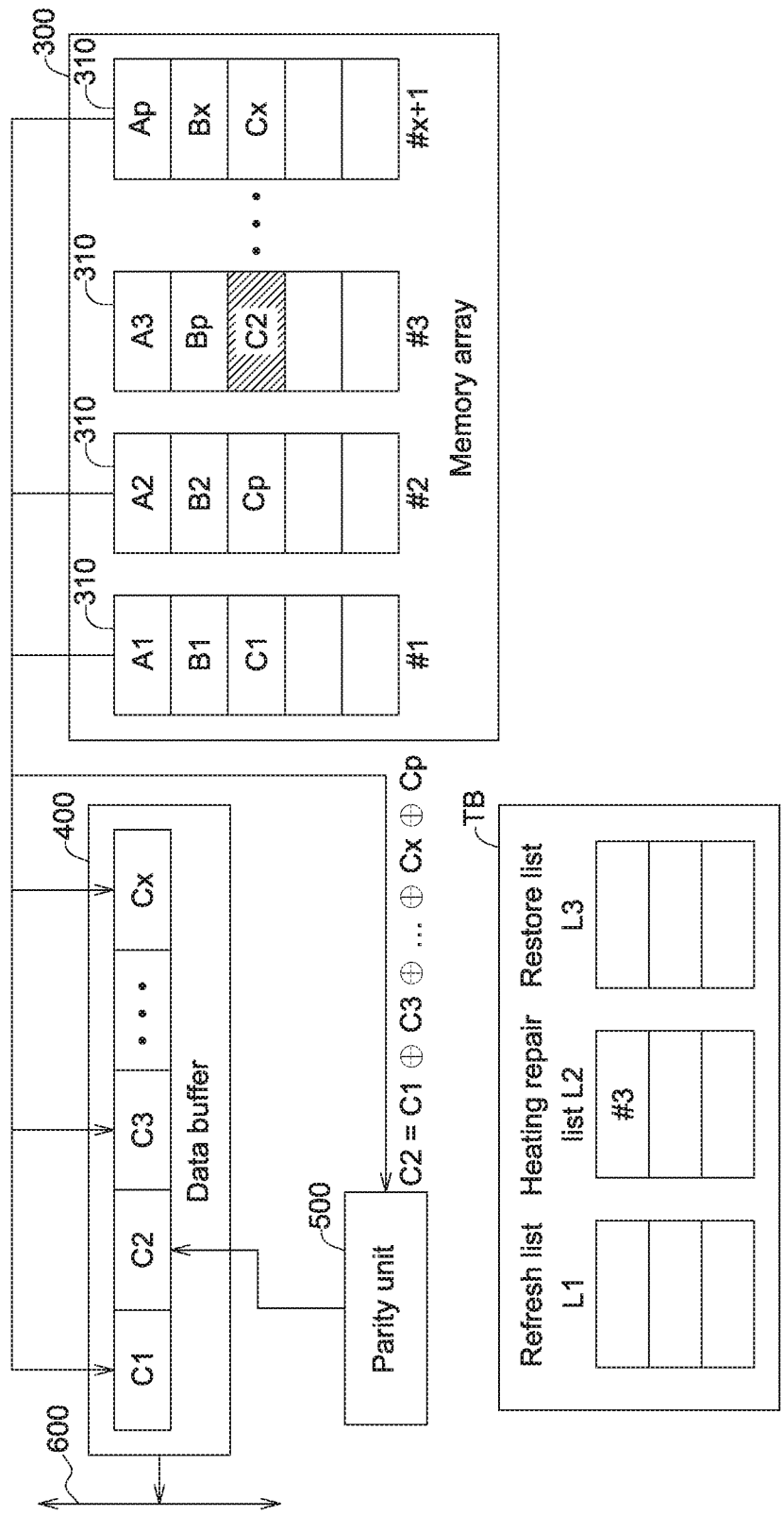
FIG. 4 illustrates another example of a reading method of the memory system.

Please refer to FIG. 4, which illustrates another example of a reading method of the memory system 1000. As shown in FIG. 4, the memory device 310 whose identifier is "#3" is unavailable to be accessed. The user data C1 to the user data Cx except the user data C2 are read to the data buffer 400, and the parity information Cp is read to the parity unit 500.

Next, the parity unit 500 can perform the equation (2) to obtain the user data C2 according to the parity information Cp and the user data C1, the user data C3, . . . , the user data Cx. In another embodiment, the recovering operation is not limited to the equation (2).

$$C2=C1 \oplus C3 \oplus \ldots \oplus Cx \oplus Cp \quad (2)$$

After the user data C2 is obtained, the user data C2 is stored in the data buffer 400, and the identifier of the memory device 310 which is unavailable to be accessed, i.e. "#3", is recorded into the heating repair list L2 of the control table TB.

Next, as shown in FIG. 4, the user data C1 to the user data Cx stored in the data buffer 400 can be totally read to the host interface 600. "#3" is recorded in the heating repair list L2, so the heating repair operation is executed at the memory device 310 whose identifier is "#3." As such, even if one of the memory devices 310 is unavailable to be accessed, the user data C1 to the user data Cx can be successfully read out and this memory device 310 can be repaired by the heating repair operation.

Figure 5:
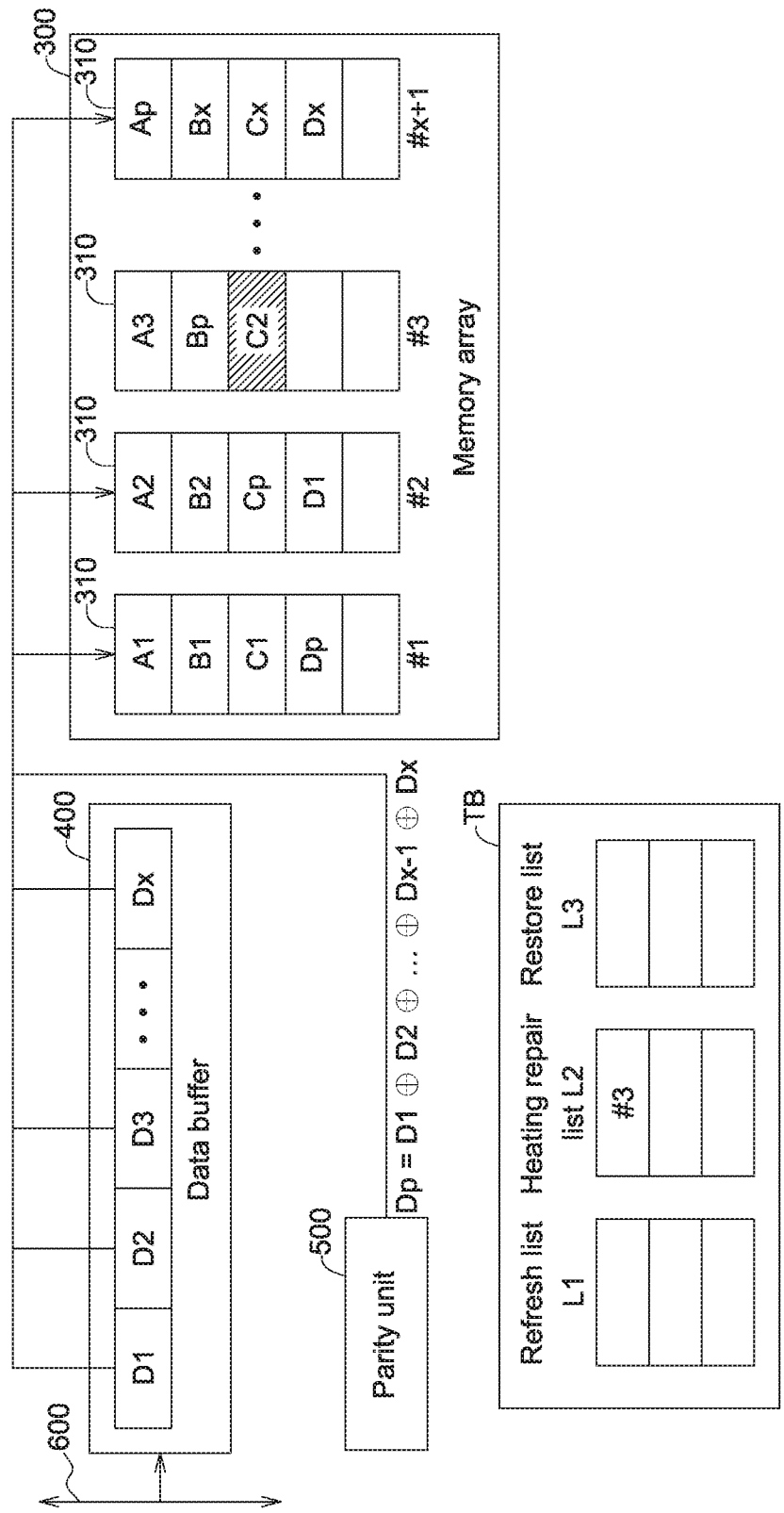
FIGS. 5 and 6 illustrate an example of a writing method of the memory system.
Figure 6:
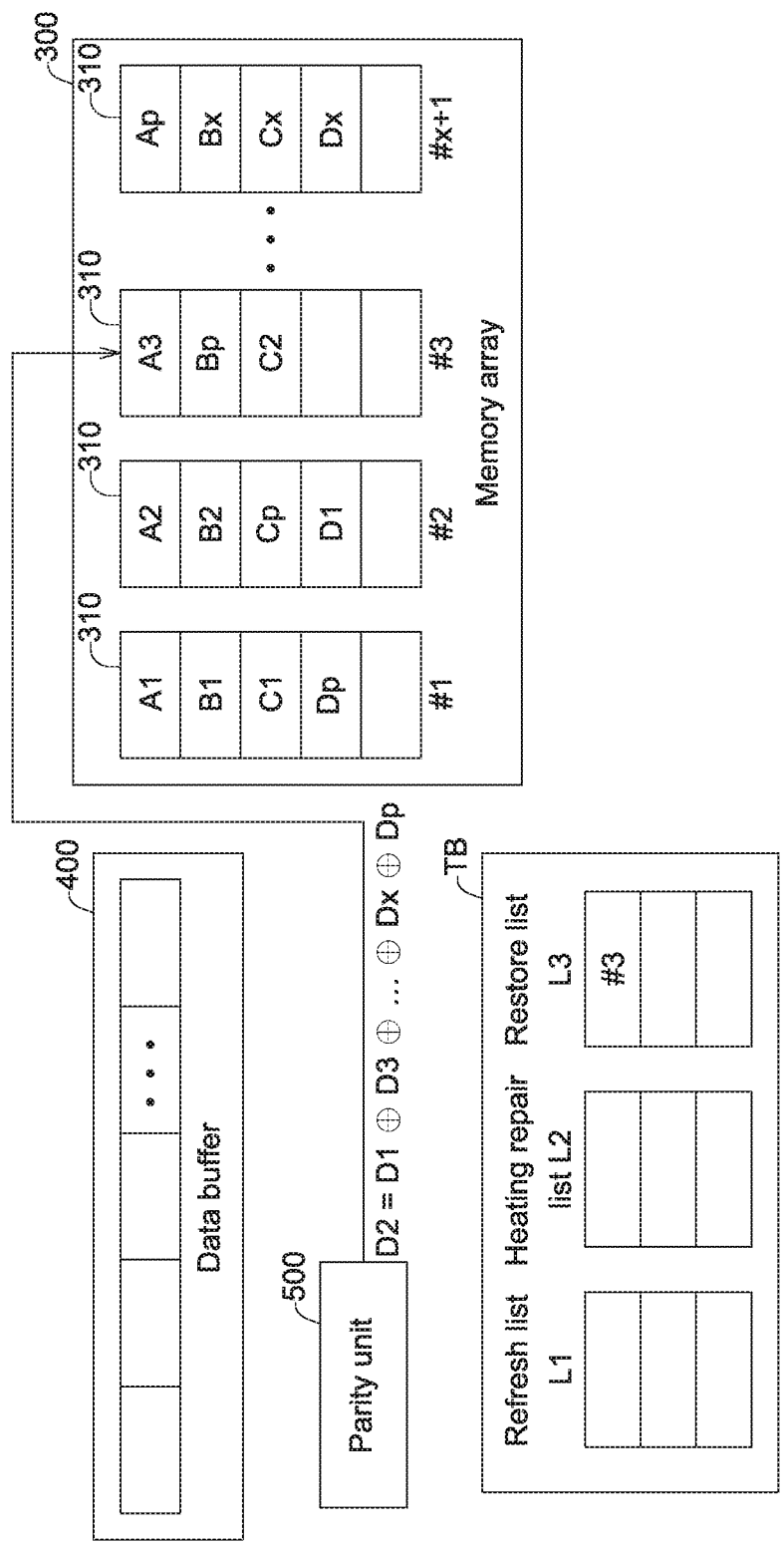

Please refer to FIGS. 5 and 6, which illustrate an example of a writing method of the memory system 1000. The user data D1, the user data D2, the user data D3, . . . , the user data Dx stored in the data buffer 400 are going to be written in the memory array 300. The parity unit 500 can perform the equation (3) to obtain the parity information Dp according to the user data D1, the user data D2, the user data D3, . . . , and the user data Dx.

$$Dp=D1 \oplus D2 \oplus \ldots \oplus Dx \quad (3)$$

As shown in FIG. 5, the memory device 310 whose identifier is "#3" is unavailable to be accessed. The user data D1 to the user data Dx except the user data D2 are written to the memory array 300, and the parity information Dp is written to the memory array 300. And, the heating repair operation is executed at the memory device 310 whose identifier is "#3."

As shown in FIG. 6, after the heating repair operation is finished, "#3" is moved to the restore list L3 of the control table TB. Next "#3" is recorded in the restore list L3, so the parity unit 500 can perform the equation (4) to obtain the user data D2 according to the user data D1, the user data D3, . . . , the user data Dx, and the parity information Dp. Then, the user data D2 is restored in the memory array 300.

$$D2=D1 \oplus D3 \oplus \ldots \oplus Dx \oplus Dp \quad (4)$$

As such, even if one of the memory devices 310 is unavailable to be accessed, the user data D1 to the user data Dx can be successfully written in the memory array 300 and this memory device 310 can be repaired by the heating repair operation.

Figure 7:
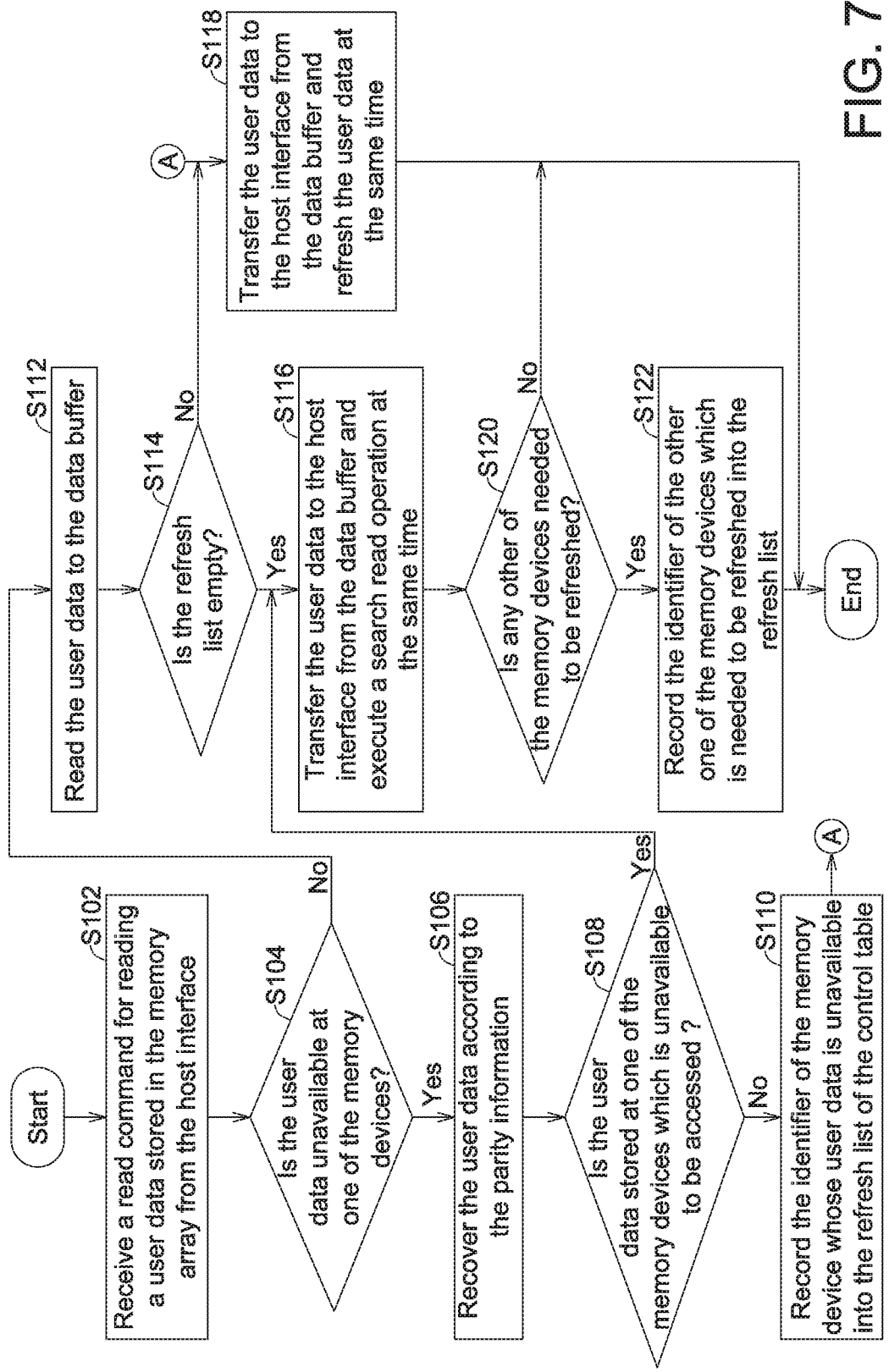
FIG. 7 shows a flowchart of a reading method of the memory system according to one embodiment.

Please refer to FIG. 7, which shows a flowchart of a reading method of the memory system 1000 according to one embodiment. In the step S102, the memory controller 200 receives a read command for reading the user data stored in the memory array 300 from the host interface 600 and read the user data to the data buffer 400.

In the step S104, whether the user data is unavailable at one of the memory devices 310 is determined. In one case, the user data is unavailable because the user data is error at one of the memory devices 310; in another case, the user data is unavailable because the user data is stored at one of the memory devices 310 which is unavailable to be access or is going to be worn out. If the user data is unavailable at one of the memory devices 310, the process proceeds to the step S106; if the user data is available at any of the memory devices 310, the process proceeds to the step S112.

In the step S106, the parity unit 500 recovers the user data according to the parity information.

In the step S108, whether the user data is stored at one of the memory devices 310 which is unavailable to be accessed is determined. If the user data is stored at one of the memory devices 310 which is unavailable to be accessed, the process proceeds to the step S116; if the user data is not stored at any of the memory devices 310 which is unavailable to be accessed, the process proceeds to the step S110.

In the step S110, the identifier of the memory device 310 whose user data is unavailable is recorded into the refresh list L1 of the control table TB.

In the step S112, the user data is read to the data buffer 400.

In the step S114, whether the refresh list L1 is empty is determined. If the refresh list L1 is empty, the process proceeds to the step S116; if the refresh list L1 is not empty, the process proceeds to the step S118.

In the step S116, the user data is transferred to the host interface 600 from the data buffer 400 and execute a search read operation at the same time. The search read operation is used to find out any memory device 310 which is needed to be refreshed.

In the step S118, the user data is transferred to the host interface 600 from the data buffer 400 and refresh the user data at the same time.

In the step S120, whether any other of the memory devices 310 is needed to be refreshed is determined under the search read operation. If one of the memory devices 310 is needed to be refreshed, the process proceeds to the step S122; if none of the memory devices 310 is needed to be refreshed, the process proceeds terminated.

In the step S122, the identifier of the other one of the memory devices 310 which is needed to be refreshed is recorded into the refresh list L1.

Figure 8:
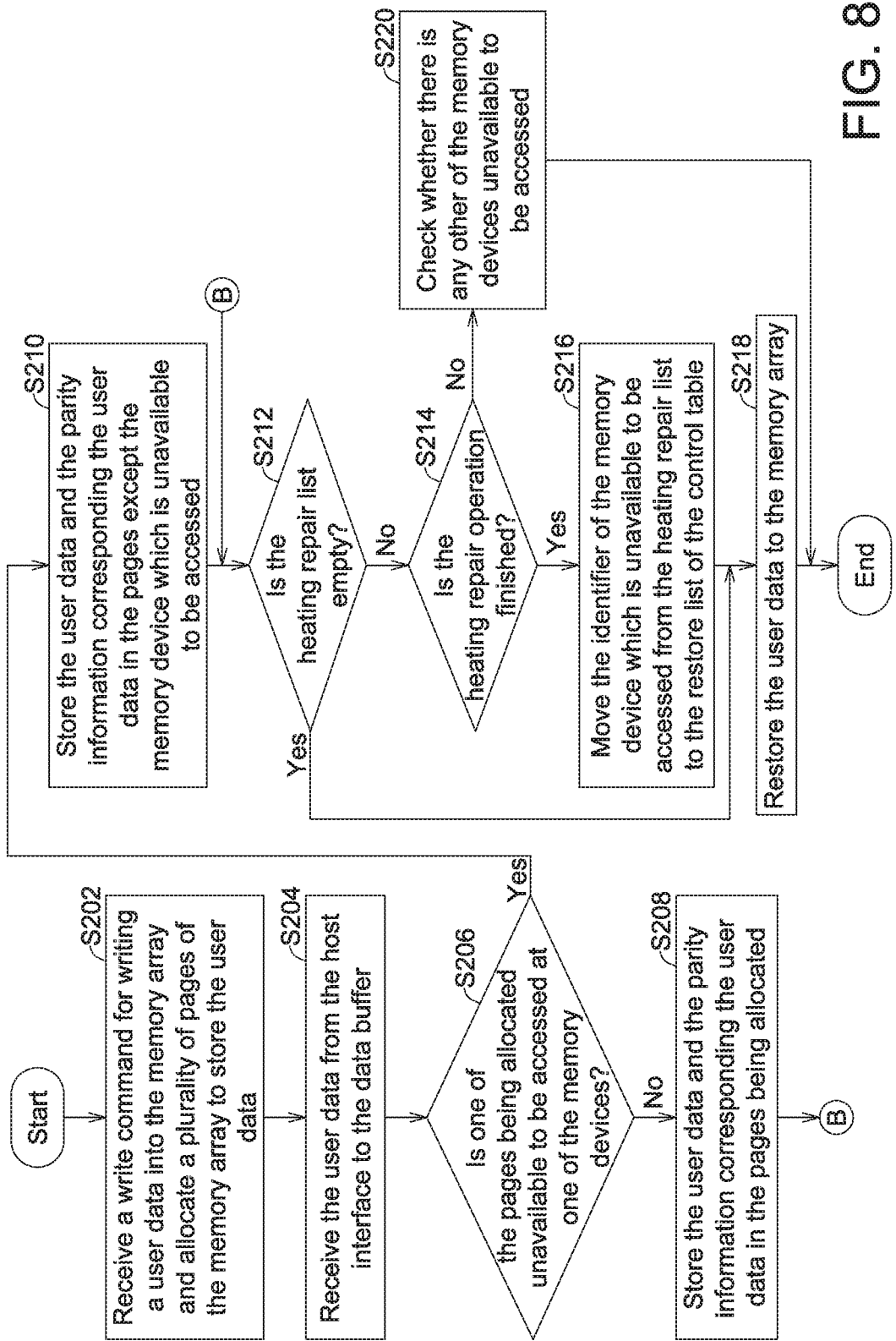
FIG. 8 shows a flowchart of the writing method of the memory system according to one embodiment.

Please refer to FIG. 8, which shows a flowchart of the writing method of the memory system 1000 according to one embodiment. In the step S202, the main controller 100 receives a write command for writing a user data into the memory array 300 and allocates a plurality of pages of the memory array 300 to store the user data.

In the step S204, the memory controller 200 receives the user data from the host interface 600 to the data buffer 400.

In the step S206, whether one of the pages being allocated is unavailable to be accessed at one of the memory devices 310 is determined. If one of the pages being allocated is unavailable to be accessed at one of the memory devices 310, the process proceeds to the step S210; if all of the pages being allocated are not unavailable to be accessed at any of the memory devices 310, the process proceeds to the step S208.

In the step S208, the user data and the parity information corresponding to the user data are stored in the pages being allocated.

In the step S210, the user data and the parity information corresponding to the user data are stored in the pages except the memory device 310 which is unavailable to be accessed.

In the step S212, whether the heating repair list L2 is empty is determined. If the heating repair list L2 is empty, the process proceeds to the step S218; if the heating repair list L2 is not empty, the process proceeds to the step S214.

In the step S214, whether the heating repair operation is finished is determined. If the heating repair operation is finished, the process proceeds to the step S216; if the heating repair operation is not finished, the process proceeds to the step S220.

In the step S216, the identifier of the memory device 310 which is unavailable to be accessed is moved from the heating repair list L2 to the restore list L3 of the control table TB.

In the step S218, the user data is restored to the memory array 300. This step is illustrated in the flowchart of FIG. 9.

Figure 10:
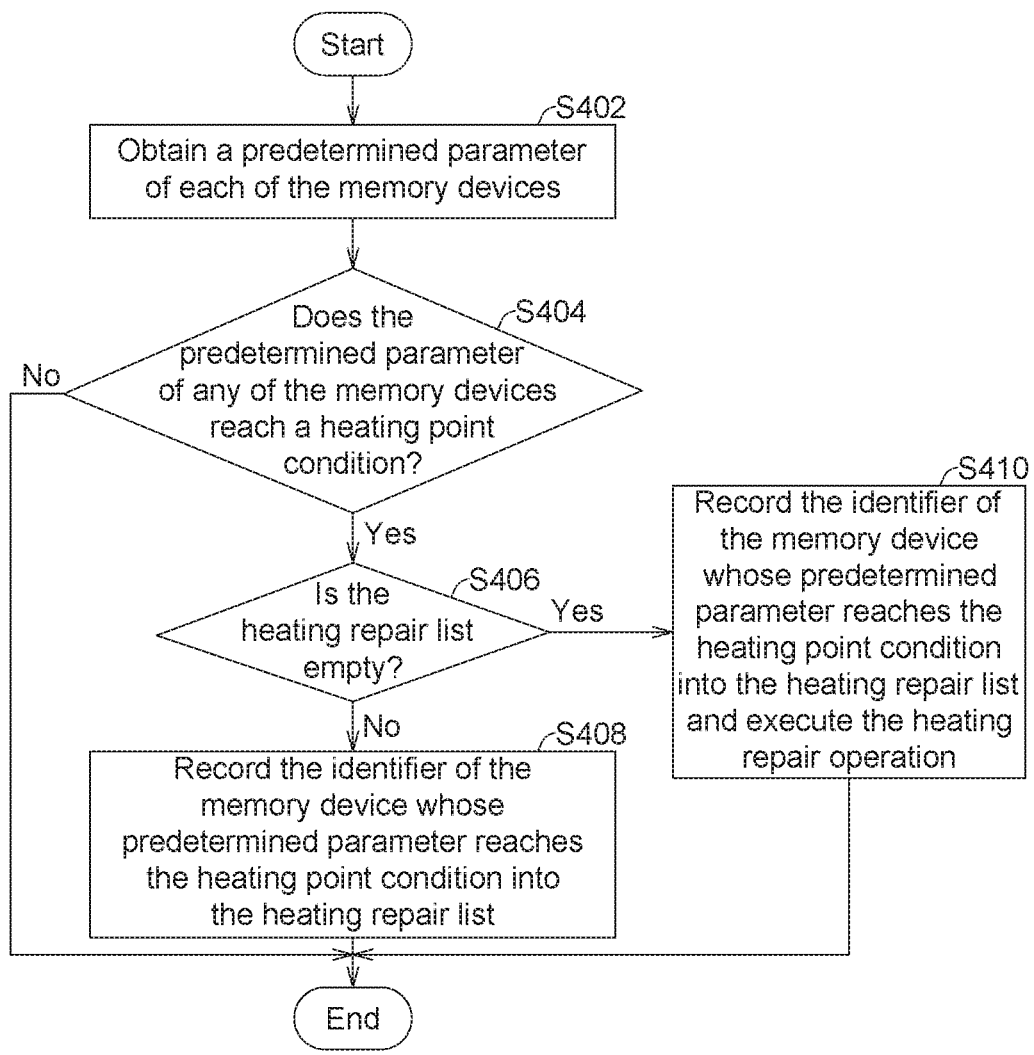
FIG. 10 shows a flowchart of the step S314 of FIG. 8.

In the step S220, whether there is any other of the memory devices 310 unavailable to be accessed is checked. This step is illustrated in the flowchart of FIG. 10.

Figure 9:
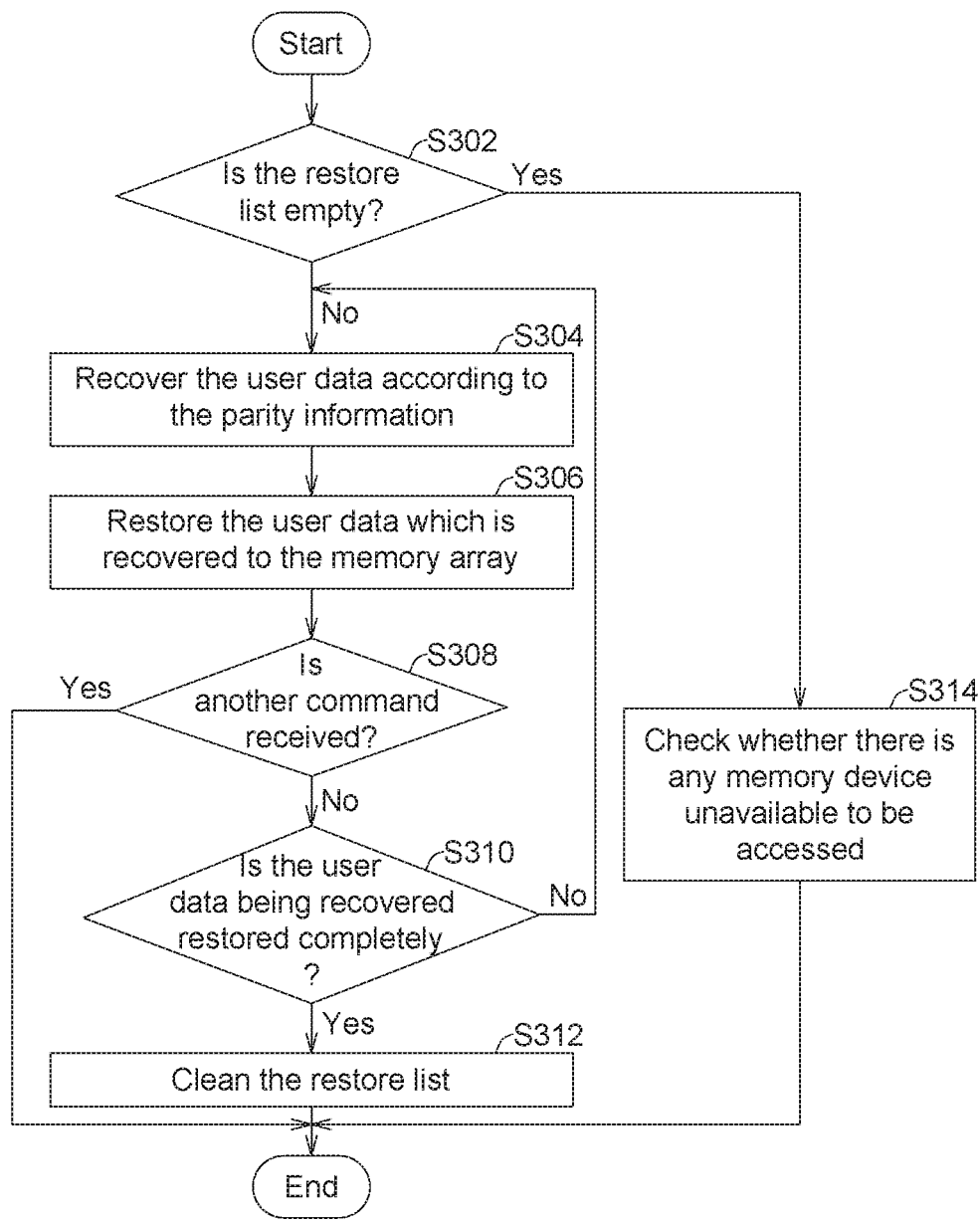
FIG. 9 shows a flowchart of the step S218 of FIG. 8.

Please refer to FIG. 9, which shows a flowchart of the step S218 of FIG. 8. In the step S302, whether the restore list L3 is empty is determined. If the restore list L3 is empty, the process proceeds to the step S314; if the restore list L3 is not empty, the process proceeds to the step S304. The step S314 is similar to the step S220.

In the step S304, the parity unit 500 recovers the user data according to the parity information.

In the step S306, the user data which is recovered is restored to the memory array 300.

In the step S308, whether another command is received is determined. If another command is received, the process is terminated; if no command is received, the process proceeds to the step S310.

In the step S310, whether the user data being recovered is restored completely. If the user data being recovered is restored completely, the process proceeds to the step S312; if the user data being recovered is not restored completely, the process proceeds the step S304.

In the step S312, the restore list L3 is cleaned.

Please refer to FIG. 10, which shows a flowchart of the step S314 of FIG. 8. In the step S402, a predetermined parameter of each of the memory devices 310 is obtained. The predetermined parameter may be an erasing count.

In the step S404, whether the predetermined parameter of any of the memory devices reaches a heating point condition is determined. For example, the heating point condition is that the erasing count reaches a predetermined value. If the predetermined parameter of any of the memory devices reaches the heating point condition, the process proceeds to the step S406; if the predetermined parameter of any of the memory devices does not reach the heating point condition, the process is terminated.

In the step S406, whether the heating repair list L2 is empty is determined. If the heating repair list L2 is empty, the process proceeds to the step S410; if the heating repair list L2 is not empty, the process proceeds to the step S408.

In the step S408, the identifier of the memory device 310 whose predetermined parameter reaches the heating point condition is recorded into the heating repair list L2.

In the step S410, the identifier of the memory device 310 whose predetermined parameter reaches the heating point condition is recorded into the heating repair list L2 and the heating repair operation is executed.

While the disclosure has been described by way of example and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A writing method of a memory system, wherein the memory system includes a memory controller and a memory array electrically connected to the memory controller, a parity information is stored in the memory array, the memory array includes a plurality of memory devices, and the writing method comprises:
   receiving a writing command for writing a user data into the memory array;
   allocating a plurality of pages of the memory array to store the user data;
   if one of the pages being allocated is unavailable to be accessed at one of the memory devices, storing the user data and the parity information corresponding to the user data in the pages being allocated except the memory device which is unavailable to be accessed;
   executing a heating repair operation on the memory device which is unavailable to be accessed, wherein the heating repair operation is performed by applying heat, such that the memory device which is unavailable to be accessed is repaired; and
   restoring the user data to the memory array after the heating repair operation is finished.

2. The writing method of the memory system according to claim 1, further comprising:
   recording an identifier of the memory device which is executed the heating repair operation into a heating repair list of a control table which is stored in the memory array.

3. The writing method of the memory system according to claim 2, further comprising:
   moving the identifier of the memory device from the heating repair list to a restore list when the heating repair operation is finished.

4. The writing method of the memory system according to claim 3, further comprising:
   removing the identifier of the memory device from the restore list when the user data is restored.

5. The writing method of the memory system according to claim 1, further comprising:
   determining whether there is any other of the memory devices needed to be executed by the heating repair operation.

6. The writing method of the memory system according to claim 5, wherein whether there is any other of the memory devices needed to be executed the heating repair operation is determined according to an erasing count.

* * * * *